(12) United States Patent
Sugiura

(10) Patent No.: US 7,990,140 B2
(45) Date of Patent: Aug. 2, 2011

(54) MRI APPARATUS

(75) Inventor: Satoshi Sugiura, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 297 days.

(21) Appl. No.: 12/244,160

(22) Filed: Oct. 2, 2008

(65) Prior Publication Data

US 2009/0091324 A1 Apr. 9, 2009

(30) Foreign Application Priority Data

Oct. 4, 2007 (JP) ................................. 2007-261360
Aug. 21, 2008 (JP) ................................. 2008-212455

(51) Int. Cl.
*G01V 3/00* (2006.01)
(52) U.S. Cl. ....................... 324/307; 324/309
(58) Field of Classification Search .................. 324/307, 324/309
See application file for complete search history.

(56) References Cited

U.S. PATENT DOCUMENTS

| | | | |
|---|---|---|---|
| 6,272,369 B1 | 8/2001 | Tan | |
| 6,483,307 B2 * | 11/2002 | Ookawa | 324/309 |
| 7,323,871 B2 * | 1/2008 | Foo | 324/307 |
| 7,639,009 B2 * | 12/2009 | Hughes et al. | 324/309 |
| 7,706,855 B1 * | 4/2010 | Priatna et al. | 600/410 |
| 2002/0183614 A1 | 12/2002 | Feiweier et al. | |

FOREIGN PATENT DOCUMENTS

| | | |
|---|---|---|
| JP | 05-285116 | 11/1993 |
| JP | 2000-225107 | 8/2000 |
| JP | 2002-325747 | 11/2002 |

OTHER PUBLICATIONS

A. Haase et al. "H NMR Chemical Shift Selective (CHESS) Imaging" Phys. Med. Biol., 1985, vol. 30, No. 4, pp. 341-344.

* cited by examiner

*Primary Examiner* — Louis M Arana
(74) *Attorney, Agent, or Firm* — Nixon & Vanderhye PC

(57) ABSTRACT

A flip-angle calculating unit calculates a flip angle of a fat-suppression pulse by inputting scanning parameters read from a scanning-parameter storage unit based on scanning conditions set by a scan-condition setting unit and a desired fat-suppression level, into a predetermined computing program. A control unit suppresses fat signals to a desired level by performing irradiation of a fat-suppression pulse having the calculated flip angle and application of a spoiler gradient magnetic field onto a scan target portion of a subject by controlling a gradient magnetic-field generating unit and a transmitting-receiving unit, and further performs irradiation of an RF pulse and application of a gradient magnetic field in accordance with a predetermined pulse sequence, thereby detecting water signals and suppressed fat signals as MR signals. An image-data creating unit creates image data by reconstructing the MR signals.

25 Claims, 9 Drawing Sheets

| SCANNING CONDITIONS | |
|---|---|
| SCAN PORTION | HEAD |
| SCAN TARGET | HEAD SCREENING |
| IMAGE CONTRAST | T2 WEIGHTED IMAGE |
| SCANNING PARAMETERS | |
| SEQUENCE TYPE | FSE (FAST SPIN ECHO) |
| REPETITION TIME (TR) | 4000 msec |
| ECHO TIME (TE) | 120 msec |
| NUMBER OF SLICES (M) | 5 |
| FIELD OF VIEW (FOV) | 22 |
| IMAGE MATRIX | 256×256 |
| ⋮ | ⋮ |

FIG.11

| SCANNING CONDITIONS | |
|---|---|
| SCAN PORTION | HEAD |
| SCAN TARGET | HEAD SCREENING |
| IMAGE CONTRAST | T2 WEIGHTED IMAGE |
| SCANNING PARAMETERS | |
| SEQUENCE TYPE | FSE (FAST SPIN ECHO) |
| REPETITION TIME (TR) | 4000 msec |
| ECHO TIME (TE) | 120 msec |
| NUMBER OF SLICES (M) | 5 |
| FIELD OF VIEW (FOV) | 22 |
| IMAGE MATRIX | 256×256 |
| | |
| FAT-SUPPRESSION FLIP ANGLE (HEAVY) | 90 DEGREES |
| FAT-SUPPRESSION FLIP ANGLE (MEDIUM) | 70 DEGREES |
| FAT-SUPPRESSION FLIP ANGLE (LIGHT) | 40 DEGREES |
| | |

FIG.12

| SEQUENCE TYPE | FLIP ANGLE OF FAT-SUPPRESSION PULSE (DEGREE) | | |
|---|---|---|---|
| | HEAVY | MEDIUM | LIGHT |
| SE 1 | 90 | 40 | 20 |
| SE 2 | 110 | 50 | 25 |
| FSE 1 | 120 | 75 | 50 |
| FSE 2 | 95 | 65 | 40 |
| FSE 3 | 100 | 55 | 35 |
| EPI 1 | 90 | 45 | 30 |
| EPI 2 | 120 | 30 | 20 |
| ⋮ | ⋮ | ⋮ | ⋮ |

MRI APPARATUS

CROSS-REFERENCE TO RELATED APPLICATIONS

This application is based upon and claims the benefit of priority from the prior Japanese Patent Application No. 2007-261360, filed on Oct. 4, 2007, and Japanese Patent Application No. 2008-212455, filed on Aug. 21, 2008; the entire contents of which are incorporated herein by reference.

BACKGROUND OF THE INVENTION

1. Field of the Invention

The present invention relates to a Magnetic Resonance Imaging (MRI) apparatus, and particularly relates to an MRI apparatus that suppresses a Magnetic Resonance (MR) signal generated from fat tissue by applying a fat-signal suppression method.

2. Description of the Related Art

A Magnetic Resonance Imaging (MRI) method is an imaging method of creating image data based on Magnetic Resonance (MR) signals generated along with excitation produced by exciting a nuclear spin in a substance placed in a static magnetic field with a high frequency pulse (Radio Frequency (RF) pulse) that has a Larmor frequency.

An MRI apparatus is a diagnostic imaging apparatus that creates image data based on MR signals detected from the inside of a living body, and can obtain various diagnostic information, such as biochemical information and functional diagnosis information as well as anatomical diagnosis information, so that the MRI apparatus is indispensable in a field of diagnostic imaging nowadays.

During an examination by using the MRI apparatus (an MRI scan), from living-body tissue including water tissue and fat tissue, MR signals generated from water tissue (i.e., MR signals arising from resonance of hydrogen nuclear spin in water tissue) and MR signals generated from fat tissue are usually collected in a mixed manner. When creating image data from MR signals from water tissue, which are clinically effective, creation of image data of high quality may be difficult in some cases due to contamination by MR signals generated from fat tissue.

To solve this problem, there has been developed a method of suppressing MR signals generated from fat tissue by applying a fat-signal suppression method, such as an Inversion Recovery (IR) method or a so-called Chemical Shift Selective (CHESS) method. The IR method uses a difference between a longitudinal relaxation time of a hydrogen nuclear spin in water tissue and a longitudinal relaxation time of a hydrogen nuclear spin in fat tissue. According to the CHESS method, only magnetization of fat tissue is excited by using a difference between resonance frequencies of a hydrogen nuclear spin in different kinds of tissue, and a transverse magnetization component of the fat tissue is caused to disappear by a spoiler pulse (for example, JP-A H05-285116 (KOKAI)).

Moreover, to further suppress MR signals generated from fat tissue, there has been proposed a fat-signal suppression method by which a flip angle of a pre-saturation pulse for fat suppression (hereinafter, "fat-suppression pulse"), due to which MR signals generated from fat tissue substantially disappear, is set in accordance with scanning conditions (for example, U.S. Pat. No. 6,272,369).

As described above, by suppressing MR signals generated from fat tissue substantially completely by applying a fat-signal suppression method, such as the CHESS method, image data based on MR signals from water tissue can be created. However, in an actual clinical case, image data including water tissue and fat tissue in a mixed manner, precisely, image data based on MR signals from water tissue and MR signals from fat tissue of which level is suppressed to a desired level, is sometimes required.

For example, when imaging bone and ligament tissue by performing an MRI scan onto a joint, MR signals collected from ligament tissue are originally feeble, and if a fat-signal suppression method is applied to the MRI scan, the MR signals collected from a bone that includes a number of fat components become extremely small. As a result, it becomes difficult to display bone and ligament tissue with a clear distinction.

Thus, an MRI scan to which a conventional fat-signal suppression method is applied has a problem that tissue having a low density of hydrogen nuclei, or tissue from which small MR signals are collected in relation to a relaxation time and a pulse sequence, and tissue including a large number of fat components cannot be separately displayed.

SUMMARY OF THE INVENTION

According to one aspect of the present invention, a Magnetic Resonance Imaging (MRI) apparatus includes a flip-angle setting unit that sets a flip angle of a fat-suppression pulse, based on a scanning condition of an MRI scan and a fat-suppression level to which a fat-signal suppression method is applied; a transmitting-receiving unit that creates a fat-suppression pulse having the flip angle; a sequence control unit that controls irradiation of the fat-suppression pulse and application of a spoiler gradient magnetic field to a scan target portion of a subject, and suppresses an MR signal generated from fat tissue in the scan target portion to a predetermined magnitude; and an image-data creating unit that creates image data based on MR signals collected by applying a certain pulse sequence to the scan target portion in which the MR signal from the fat tissue is suppressed.

According to another aspect of the present invention, an MRI apparatus includes a fat-suppression level input unit that receives an input of a fat-suppression level of an MRI scan to which a fat-signal suppression method is applied; a scanning-condition setting unit that sets a parameter of a fat-suppression condition for fat suppression, based on a scanning condition of the MRI scan and the fat-suppression level; a sequence control unit that controls irradiation of a fat-suppression pulse with the set parameter and application of a spoiler gradient magnetic field to a scan target portion of a subject, and suppresses an MR signal generated from fat tissue in the scan target portion to a predetermined magnitude; and an image-data creating unit that creates image data based on MR signals collected by applying a certain pulse sequence to the scan target portion in which the MR signal from the fat tissue is suppressed.

BRIEF DESCRIPTION OF THE DRAWINGS

FIG. 11 is a diagram illustrating a variation of a flip-angle setting method according to the embodiment;

FIG. 12 is a diagram illustrating another variation of the flip-angle setting method according to the embodiment;

DETAILED DESCRIPTION OF THE INVENTION

Exemplary embodiments of the present invention will be explained below with reference to the accompanying drawings.

According to the following embodiments, first of all, a flip angle of a fat-suppression pulse is set based on scanning conditions of a Magnetic Resonance Imaging (MRI) scan to which a fat-signal suppression method is applied, and a fat-suppression level. Next, through a fat-suppression sequence aimed at suppressing a Magnetic Resonance (MR) signal generated from fat tissue (hereinafter, "fat signal"), a fat signal is suppressed to a desired level by performing irradiation of a fat-suppression pulse that has the flip angle and application of a spoiler gradient magnetic field onto a scan target portion of a subject. Then, through an MR-signal collection sequence following to the fat-suppression sequence, irradiation of a Radio Frequency (RF) pulse and application of a gradient magnetic field are performed onto the scan target portion in accordance with a certain pulse sequence, so that MR signals generated from water tissue (water signals) and the suppressed fat signals are detected. An image data is then created by processing the obtained water signals and the obtained fat signals.

Although the following embodiments are described in a case where MR signals (namely, water signals and suppressed fat signals) generated from a scan target portion of a subject are collected by applying a Spin Echo (SF) method using a 90-degree pulse and a 180-degree pulse, the present invention is not limited to this, and another method, such as a Fast Spin Echo (FSE) method, a Field Echo (FE) method, or an Echo Planar Imaging (EPI) method, can be applied.

(Configuration of Apparatus)

Figure 1:
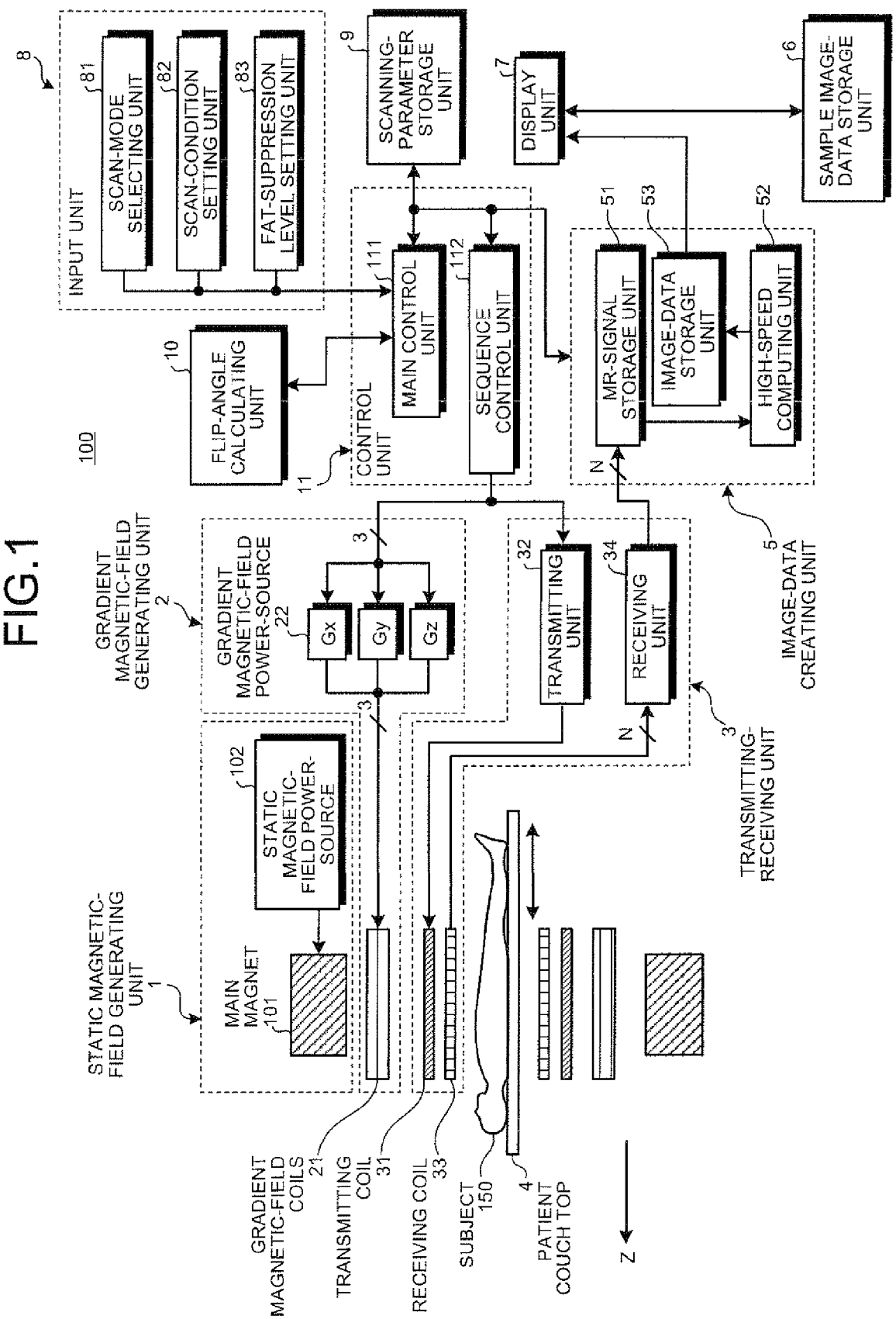
FIG. 1 is a block diagram illustrating an entire configuration of a Magnetic Resonance imaging (MRI) apparatus according to an embodiment of the present invention.

A configuration of Magnetic Resonance Imaging (MRI) apparatus according to an embodiment of the present invention is explained below with reference to FIG. 1. FIG. 1 is a block diagram illustrating an entire configuration of the MRI apparatus according to the embodiment.

An MRI apparatus 100 shown in FIG. 1 includes a static magnetic-field generating unit 1, a gradient magnetic-field generating unit 2, a transmitting-receiving unit 3, a patient couch top 4, an image-data creating unit 5, a sample image-data storage unit 6, and a display unit 7. The static magnetic-field generating unit 1 generates a static magnetic field and the gradient magnetic-field generating unit 2 generates a gradient magnetic field over a subject 150. The transmitting-receiving unit 3 irradiates the subject 150 with an RF pulse, and receives of an MR signal. The subject 150 is to be placed on the patient couch top 4. The image-data creating unit 5 creates image data by reconstructing the MR signal received by the transmitting-receiving unit 3. The sample image-data storage unit 6 preliminarily stores therein a plurality of sample image data corresponding to various fat-suppression levels. The display unit 7 displays thereon image data created by the image-data creating unit 5 and sample image data read from the sample image-data storage unit 6 based on a fat-suppression level.

Furthermore, the MRI apparatus 100 includes an input unit 8, a scanning-parameter storage unit 9, a flip-angle calculating unit 10, and a control unit 11. The input unit 8 receives an input of subject information, a selection of a scan mode, a setting of scanning conditions, a setting of a fat-suppression level, and an input of various command signals. The scanning-parameter storage unit 9 preliminarily stores therein information about scanning parameters corresponding to various scanning conditions. The flip-angle calculating unit 10 calculates a flip angle of a fat-suppression pulse based on setting information about a fat-suppression level supplied from the input unit 8, and information about scanning parameters supplied from the scanning-parameter storage unit 9. The control unit 11 totally controls each of the above units in the MRI apparatus 100.

The static magnetic-field generating unit 1 includes a main magnet 101 that is configured from a normal conducting magnet or a superconducting magnet, and a static magnetic-field power-source 102 that drives the main magnet 101. The static magnetic-field power-source 102 generates a strong static magnetic field over the subject 150 arranged in a scan field in a not-shown gantry by supplying a predetermined electric current to the main magnet 101. The main magnet 101 can be configured by a permanent magnet.

On the other hand, the gradient magnetic-field generating unit 2 includes a plurality of gradient magnetic-field coils 21 and a gradient magnetic-field power-source 22. The gradient magnetic-field coils 21 generate gradient magnetic fields in the x-axis direction, the y-axis direction and the z-axis direction, which are orthogonal to each other. The gradient magnetic-field power-source 22 supplies a pulse current to each of the gradient magnetic-field coils 21.

During the fat-suppression sequence aimed at suppressing fat signals, the gradient magnetic-field power-source 22 supplies to the gradient magnetic-field coils 21 a pulse current for applying a spoiler gradient magnetic field Gp to an irradiation area of a fat-suppression pulse irradiated from a transmitting coil 31, which will be described later. A macroscopic transverse magnetization component that is included in a magnetization vector of fat tissue and inclined by a flip angle α by irradiation of a fat-suppression pulse then disappears (saturates) due to application of the spoiler gradient magnetic field.

On the other hand, during the MR-signal collection sequence, the gradient magnetic-field power-source 22 performs encoding over the scan field in the gantry in which the subject 150 is arranged. Precisely, the gradient magnetic-field power-source 22 generates a gradient magnetic field in each of the x-axis direction, the y-axis direction, and the z-axis direction by controlling a pulse current supplied to each of the gradient magnetic-field coils 21 for the respective directions based on a sequence control signal supplied from the control unit 11. The gradient magnetic fields in the x-axis direction, the y-axis direction, and the z-axis direction are then combined, accordingly, a slice-selective gradient magnetic field Gs, a phase encoding gradient magnetic field Ge, and a readout (frequency encoding) gradient magnetic field Gr, which are orthogonal to each other, are generated in desired directions. In other words, the generated gradient magnetic fields Gs, Ge, and Gr, as well as the spoiler gradient magnetic field Gp are superimposed on the static magnetic field generated by the main magnet 101, and then applied to the subject 150.

The transmitting-receiving unit 3 includes the transmitting coil 31 and a transmitting unit 32 that irradiate the subject 150 with an RF pulse, and a receiving coil 33 and a receiving unit 34 that receive MR signals (water signals and fat signals) generated from the subject 150. However, a transmitting-receiving coil that performs a function of the transmitting coil 31 and a function of the receiving coil 33 as one coil can be used.

Figure 2:
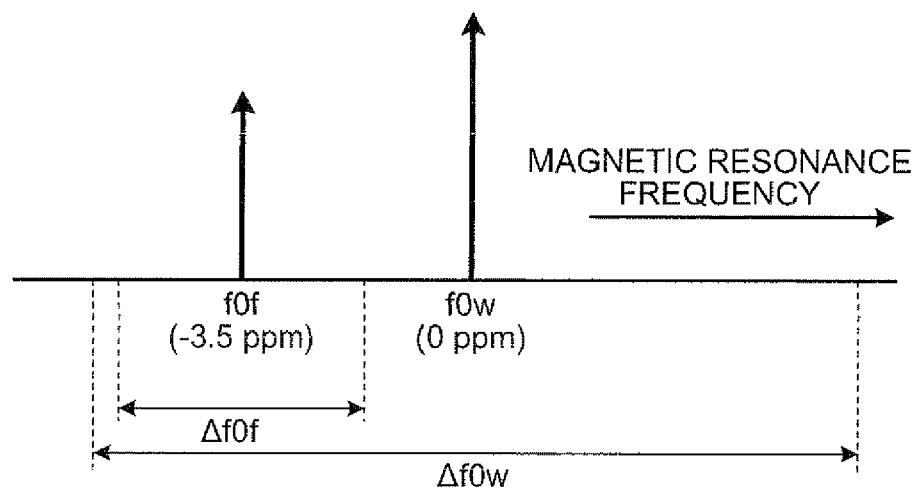
FIG. 2 is a diagram illustrating magnetic resonance frequencies of water tissue and fat tissue.

The transmitting unit 32 generates an RE-pulse current that has a carrier wave of the same frequency as a magnetic-resonance frequency (Larmor frequency) of a hydrogen nuclear spin in fat tissue and water tissue determined in accordance with the strength of the static magnetic field of the main magnet 101, and is modulated with a predetermined selective-excitation waveform, based on a sequence control signal supplied from the control unit 11. FIG. 2 depicts a magnetic resonance frequency f0$w$ of water tissue and a magnetic resonance frequency f0$f$ of fat tissue. Suppose that the magnetic resonance frequency f0$w$ of water tissue is the reference value (0 ppm), the magnetic resonance frequency f0$f$ of fat tissue is present at −3.5 ppm on the frequency axis.

In this case, the transmitting unit 32 in the fat-suppression sequence generates a pulse current for generating a fat-suppression pulse that has a predetermined frequency band Δf0$f$ and its center frequency at the magnetic resonance frequency f0$f$ of fat tissue. Similarly, the transmitting unit 32 in the MR-signal collection sequence generates a pulse current for generating a 90-degree RF pulse and a 180-degree RF pulse each of which has a predetermined frequency band Δf0$w$ and its center frequency at the magnetic resonance frequency f0$w$ of water tissue.

The transmitting coil 31 shown in FIG. 1 is driven with a pulse current supplied from the transmitting unit 32, irradiates a scan target portion of the subject 150 during the fat-suppression sequence with a fat-suppression pulse, and irradiates the scan target portion during the MR-signal collection sequence with the 90-degree RE pulse and the 180 degree RE pulse.

On the other hand, the receiving coil 33 detects MR signals (water signals and fat signals) generated from water tissue and fate tissue in the scan target portion of the subject 150 by irradiation of the 90-degree RF pulse and the 180-degree RF pulse. The receiving coil 33 is usually configured to include a so-called array coil in which a plurality of coils (N pieces) with a small diameter are arranged for detecting MR signals with a high sensitivity.

The receiving unit 34 includes an amplifier circuit with N channels, an intermediate-frequency changing circuit, a detection circuit, a filtering circuit, and an analog-digital converter, which are not shown. After performing signal processing, such as an amplification, an intermediate frequency change, phase detection, filtering, and the like onto a weak MR signal detected by the receiving coil 33, the receiving unit 34 converts the weak MR signal from analog to digital. The amplifier circuit is usually provided in the vicinity of the receiving coil 33 for amplifying an MR signal detected by the receiving coil 33 with a high signal-to-noise ratio.

The main magnet 101, the gradient magnetic-field coils 21, the transmitting coil 31, and the receiving coil 33 are provided in the not-shown gantry of the MRI apparatus 100, and a field of view is formed in the center area of the gantry. Precisely, the scan field into which the subject 150 is to be inserted together with the patient couch top 4 is provided in the center of the gantry, and the receiving coil 33, the transmitting coil 31, the gradient magnetic-field coils 21, and the main magnet 101 are arranged around the field of view coaxially with one another having the z-axis as the axis of concentric circles.

The patient couch top 4 is attached slidably in the z-axis direction on the top surface of a not-shown patient couch arranged in the vicinity of the gantry. The patient couch top 4 sets a scan target portion of the subject 150 at a desired position in the scan field by moving the subject 150 placed on the patient couch top 4 in the body axis direction (z-axis direction). When setting the scan target portion, movement of the patient couch top 4 such that the scan target portion faces to the receiving coil 33 provided in the vicinity of the scan field is controlled by a top-plate moving mechanism and a tabletop movement control unit, which are not shown.

The image-data creating unit 5 includes an MR-signal storage unit 51, a high-speed computing unit 52, and an image-data storage unit 53. The MR-signal storage unit 51 sequentially stores therein MR signals of N channels on which an intermediate frequency conversion, phase detection, and analog-to-digital conversion are performed by the receiving unit 34 of the transmitting-receiving unit 3, together with scan position information (such as slice encoding information, phase encoding information, and the like) supplied from the control unit 11.

On the other hand, the high-speed computing unit 52 reads MR signals and scan position information that are once stored in the MR-signal storage unit 51, and creates image data by performing image reconstruction processing by a two-dimensional Fourier transform. The obtained image data is then stored in the image-data storage unit 53. However, instead of creating two-dimensional image data by reconstructing two-dimensional MR signals supplied from the receiving unit 34, the high-speed computing unit 52 can create volume data (three-dimensional data) by performing a three-dimensional Fourier transform on three-dimensional MR signals supplied from the receiving unit 34, and can create three-dimensional image data or Multi Planar Reconstructions (MPR) image data. In such case, the high-speed computing unit 52 has, for example, a function of creating three-dimensional image data, such as volume rendering image data or surface rendering image data by rendering volume data, or a function of creating MPR image data on a desired slice of the volume data.

The sample image-data storage unit 6 preliminarily stores therein a plurality of image data that are collected from the subject 150 or another subject in advance with respect to various fat-suppression levels as sample image data. Moreover, the sample image-data storage unit 6 stores therein scanning conditions, such as a scan portion, a scan target, and an image contrast, and information about the fat-suppression level, as additional information about the sample image data.

The display unit 7 includes a display-data creating circuit and a monitor, which are not shown. The display-data creating circuit converts image data of the subject 150 at a desired fat-suppression level created by the image-data creating unit 5, or sample image data read from the sample image-data storage unit 6 based on a fat-suppression level and scanning conditions supplied from the input unit 8, into a predetermined display format, then creates display data, and displays the obtained display data onto the monitor.

The display-data creating circuit includes a not-shown image-data computing unit that performs computation between image data. For example, if sample image data that has a desired fat-suppression level is not present in the sample image-data storage unit 6, the display-data creating circuit reads sample image data corresponding to a plurality of fat-suppression levels under the scanning conditions (first sample image data), which is set via the input unit 8 or automatically set at the control unit 11, from the sample image-data storage unit 6, and creates sample image data that has a desired fat-suppression level (second sample image data) by performing weighted addition on the read image data.

The input unit 8 is an interface that includes a display panel and various input devices, such as a switch, a keyboard, a mouse, a slide lever, on an operation panel, and includes a scan-mode selecting unit 81, a scan-condition setting unit 82, and a fat-suppression level setting unit 83. The scan-mode selecting unit 81 selects one of a normal scan mode, and a fat-suppression scan mode. The scan-condition setting unit 82 sets scan conditions for the MRI scan. The fat-suppression level setting unit 83 sets a fat-suppression level in the fat suppression mode. Furthermore, input of subject information, setting of image-data creation conditions and image-data display conditions, and input of various command signals are also performed by using the input devices and the display panel.

Figure 3A:
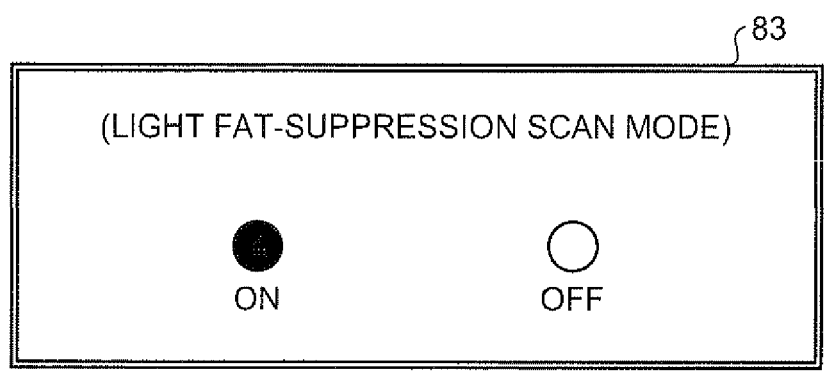
FIGS. 3A and 3B are diagrams illustrating concrete examples of a fat-suppression level setting unit included in the MRI apparatus according to the embodiment.
Figure 3B:
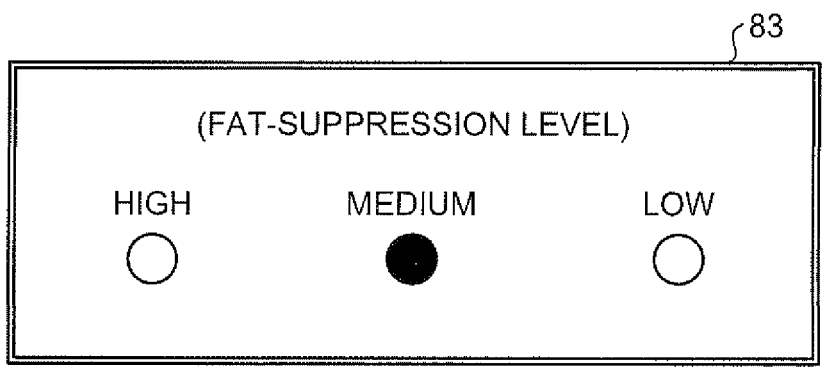
Figures 4, 5:
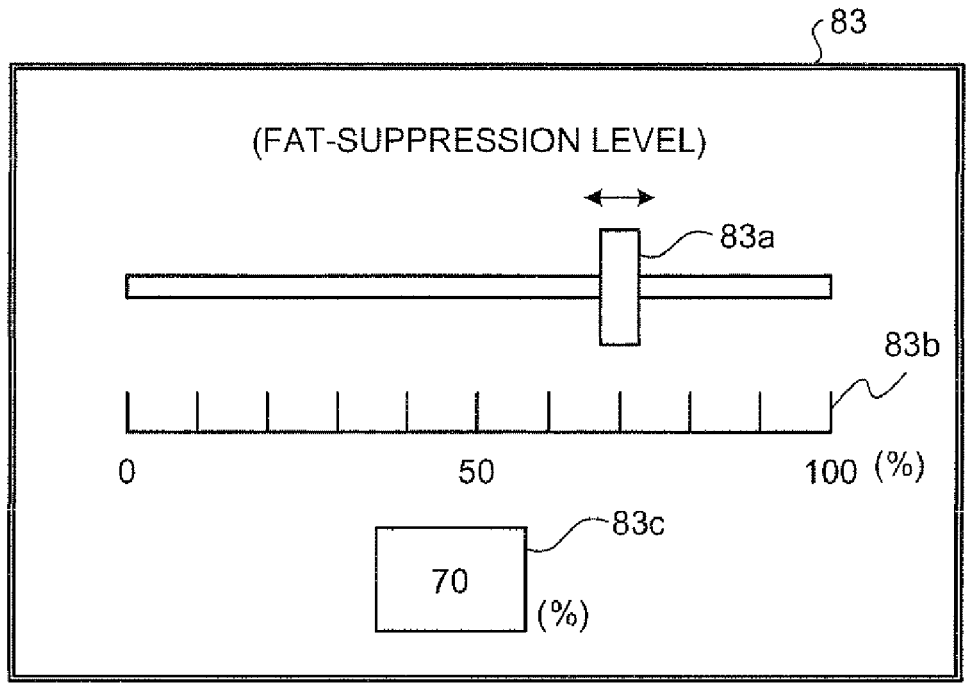
FIG. 4 is a diagram illustrating another concrete example of the fat-suppression level setting unit included in the MRI apparatus according to the embodiment.
FIG. 5 is a diagram illustrating a concrete example of scanning parameters according to the embodiment.

FIGS. 3A, 3B and 4 depict concrete examples of the fat-suppression level setting unit 83 to be used after the fat-suppression scan mode is selected by the scan-mode selecting unit 81. FIG. 3A depicts the fat-suppression level setting unit 83 that can select a mode from among a heavy fat-suppression scan mode and a light fat-suppression scan mode. The heavy fat-suppression scan mode is a mode of creating image data by suppressing fat signals substantially 100% as conventionally carried out. The light fat-suppression scan mode is a mode of creating image data by suppressing fat signals to a desired level. For example, the light fat-suppression scan mode is selected by selecting a radio button ON provided on the fat-suppression level setting unit 83, and the heavy fat-suppression scan mode is selected by selecting a radio button OFF. When the light fat-suppression scan mode is selected by the above method, a fat-suppression level that is predetermined for the fat-suppression scan mode, for example, a 70% fat-suppression level, is set.

The fat-suppression level setting unit 83 shown in FIG. 3B includes a radio button "high" to select a heavy fat-suppression scan mode, a radio button "medium" to select a medium fat-suppression scan mode, and a radio button "low" to select a light fat-suppression scan mode, and is configured to be used when selecting a desired fat-suppression level from among predetermined three fat-suppression levels. For example, a 100% fat-suppression level, a 70% fat-suppression level, and a 30% fat-suppression level are set by selecting the radio button "high", the radio button "medium", and the radio button "low", respectively. Although FIG. 3B is described in a case where a desired fat-suppression level is selected from among the three fat-suppress-on levels, namely, 100%, 70%, and 30% by selecting one of the radio buttons "high", "medium", and "low", levels and values of the fat-suppression levels are not limited to these.

Compared to the fat-suppression level setting unit 83 that selects and sets a desired fat-suppression level from among a plurality of predetermined fat-suppression levels as shown in FIGS. 3A and 3B, FIG. 4 depicts a concrete example of the fat-suppression level setting unit 83 that can set the fat-suppression level to an arbitrary value. Precisely, the fat-suppression level setting unit 83 shown in FIG. 4 includes a lever 83a that can be slid rightward and leftward, so that the fat-suppression level can be set to an arbitrary value by moving the lever 83a to a desired position of a fat-suppression level scale 83b provided below the lever 83a. The value of the set fat-suppression level is displayed on a fat-suppression level display unit 83c. Moreover, a similar function can be obtained by inputting the value of a fat-suppression level by using a keyboard provided on the input unit 8.

The fat-suppression level set by the fat-suppression level setting unit 83 shown in FIG. 3A, 3B or 4 is then supplied to the flip-angle calculating unit 10 via the control unit 11 together with scanning conditions of the MRI scan supplied from the scan-condition setting unit 82. The flip-angle calculating unit 10 then calculates a flip angle of the fat-suppression pulse that is to achieve the fat-suppression level.

Returning to FIG. 1, the scanning-parameter storage unit 9 preliminarily stores therein scanning parameters corresponding to various scanning conditions including a scan portion, a scan target, and an image contrast. FIG. 5 depicts a concrete example of scanning parameters corresponding to scanning conditions, for example, under the scanning conditions, namely, the scan portion is the head, the scan target is the head screening, and the image contrast is "T2 weighted image"; predetermined various scanning parameters (sequence type (sequence name), repetition time TR, echo time TE, the number of slices M, field of view FOV, image matrix, and the like) are stored.

Similarly, the scanning-parameter storage unit 9 also stores therein scanning parameters determined correspondingly to scanning conditions including scan portions, such as the chest, the neck, the abdomen, and the pelvic part; scan targets, such as brain tumor, lung disease, abdominal tumor, and cervical vertebra abnormality; and furthermore, image contrasts, such as T1 highlighted image. Scanning parameters corresponding to information about scanning conditions supplied from the scan-condition setting unit 82 of the input unit 8 are then read from the scanning-parameter storage unit 9, and supplied to the flip-angle calculating unit 10 via the control unit 11.

Returning again to FIG. 1, the flip-angle calculating unit 10 includes an arithmetic circuit and a memory circuit, which are not shown, and calculates a flip angle of a fat-suppression pulse that is to achieve a desired fat-suppression level based on the above scanning parameters supplied from the scanning-parameter storage unit 9.

Figure 6:
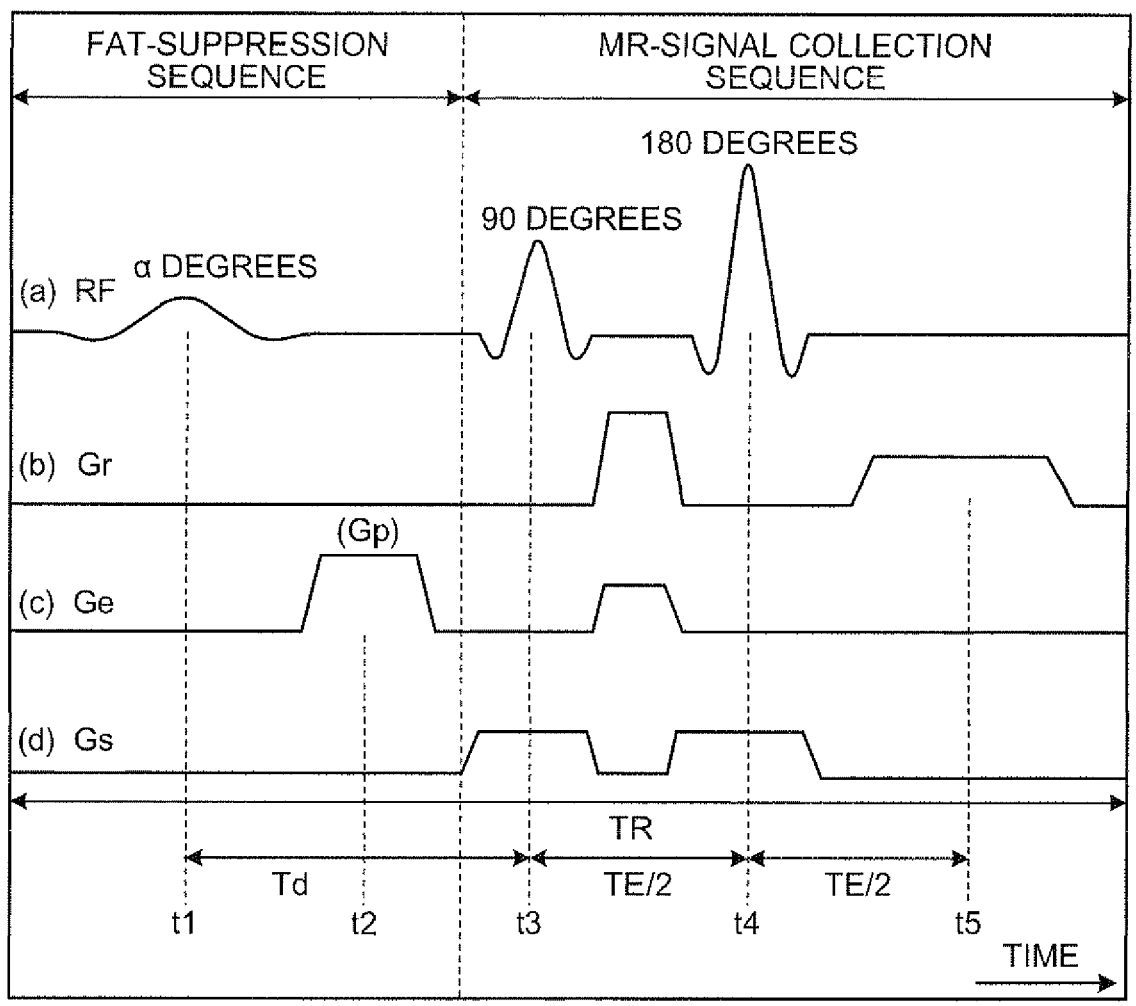
FIG. 6 is a diagram illustrating a pulse sequence of an MRI scan used in a fat-suppression scan mode according to the embodiment.

A calculating method of a flip angle performed by the flip-angle calculating unit 10 is explained below with reference to FIG. 6. FIG. 6 depicts a pulse sequence of an MRI scan using, as a pre-pulse, a fat-suppression pulse having a flip angle α that achieves a desired fat-suppression level. The pulse sequence includes the fat-suppression sequence for suppressing fat signals generated from a scan target portion by irradiating the scan target portion of the subject 150 with a fat-suppression pulse, and the MR-signal collection sequence for collecting MR signals from water tissue (water signals) and MR signals from fat tissue (fat signals) that are suppressed by applying the SBE method to the scan target portion from which the fat signals are suppressed.

At a time t1 in the fat-suppression sequence, as described above with reference to FIG. 2, a fat-suppression pulse that has the frequency band $\Delta f0f$ and its center frequency at the magnetic resonance frequency $f0f$ of fat tissue, which is lower than the magnetic resonance frequency f0w of water tissue by 3.5 ppm, is irradiated over a relatively wide area of the scan target portion that is determined in accordance with a size of the transmitting coil 31, and a magnetization vector of the fat tissue present in the irradiation area is inclined by the flip angle α.

Subsequently, at a time t2 in the fat-suppression sequence following to the irradiation of the fat-suppression pulse, a transverse magnetization component of the magnetization vector inclined by α degree is given with a phase difference, for example, by applying the spoiler gradient magnetic field Gp in a phase encoding direction, so that the macroscopic transverse magnetization component of the magnetization vector is caused to disappear (saturate).

Subsequently, at the time t3 in the MR-signal collection sequence after the time interval Td has elapsed since the irradiation of the fat-suppression pulse, the 90-degree RF pulse and the slice-selective gradient magnetic field Gs for selecting a slice are applied onto the scan target portion, a plurality of magnetization vectors of water tissue of a selected slice is inclined by 90 degrees.

At a time t4 after a time interval TE/2 from the irradiation of the 90-degree RF pulse, the 180-degree RF pulse is irradiated onto the same scan target portion, so that a phase difference in the magnetization vectors of the water tissue, which is increasing during a period [t3-t4], is gradually decreased by irradiation of the 180-degree RF pulse. At a time t5 after a time interval TE/2 from the irradiation of the 180-degree RF pulse, the phases of the magnetization vectors match with each other and an MR signal is generated, and the MR signal is then detected by the receiving coil 33 under presence of the readout gradient magnetic field Gr applied at the time t5, and supplied to the receiving unit 34. MR signals with respect to one of phase encoding directions are collected through the above procedure, and MR signals of one slice required for creating image data are collected by further repeating the similar procedure while sequentially renewing the phase encoding gradient magnetic field Ge.

When collecting the MR signals, if a repetition time TR is sufficiently longer than a longitudinal relaxation time T1 of fat tissue, a longitudinal magnetization component of the magnetization vector of fat tissue that is saturated in the fat-suppression sequence is substantially fully recovered, and then being inclined again by α degree with a next fat-suppression pulse that is irradiated after TR. At that time, if the time interval Td between the irradiation of the fat-suppression pulse at the time t1 and the irradiation of the 90-degree RF pulse at the time t3 is sufficiently shorter than the longitudinal relaxation time T1 of fat tissue, the longitudinal magnetization component of the magnetization vector of the fat tissue immediately before the irradiation of the 90-degree RF pulse is substantially equal to the longitudinal magnetization component immediately after irradiation of the fat-suppression pulse. Consequently, MR signals of which fat signals are suppressed based on the fat-suppression pulse having the flip angle α are collected from the scan target portion of the subject 150.

When continuously carrying out collection of MR signals with respect to different phase encodings by repeating irradiation of the fat-suppression pulse having the flip angle α with the repetition time TR, a longitudinal magnetization component Mz+ of a magnetization vector of fat tissue immediately after irradiation of a fat-suppression pulse, and a longitudinal magnetization component M0 of the magnetization vector in the initial state before the irradiation of the fat-suppression pulse are in the relation expressed in Expression (1) described below, where the longitudinal relaxation time of the fat tissue is T1.

$$\frac{Mz+}{M0} \propto \frac{\{1 - \exp(-\frac{TR}{T1})\}\cos\alpha}{1 - \cos\alpha \cdot \exp(-\frac{TR}{T1})} \qquad (1)$$

Furthermore, a longitudinal magnetization component Mzf of the magnetization vector immediately before irradiation of the 90-degree RF pulse and the longitudinal magnetization component M0 of the magnetization vector in the initial state are expressed in Expression (2) described below by taking into account a relaxation process of the longitudinal magnetization component Mz+ performed during a period between [t1-t3].

$$\frac{Mzf}{M0} \propto \frac{Mz+}{M0} + \left(1 - \frac{Mz+}{M0}\right)\left\{1 - \exp\left(-\frac{Td}{T1}\right)\right\} \qquad (2)$$

Figure 7:
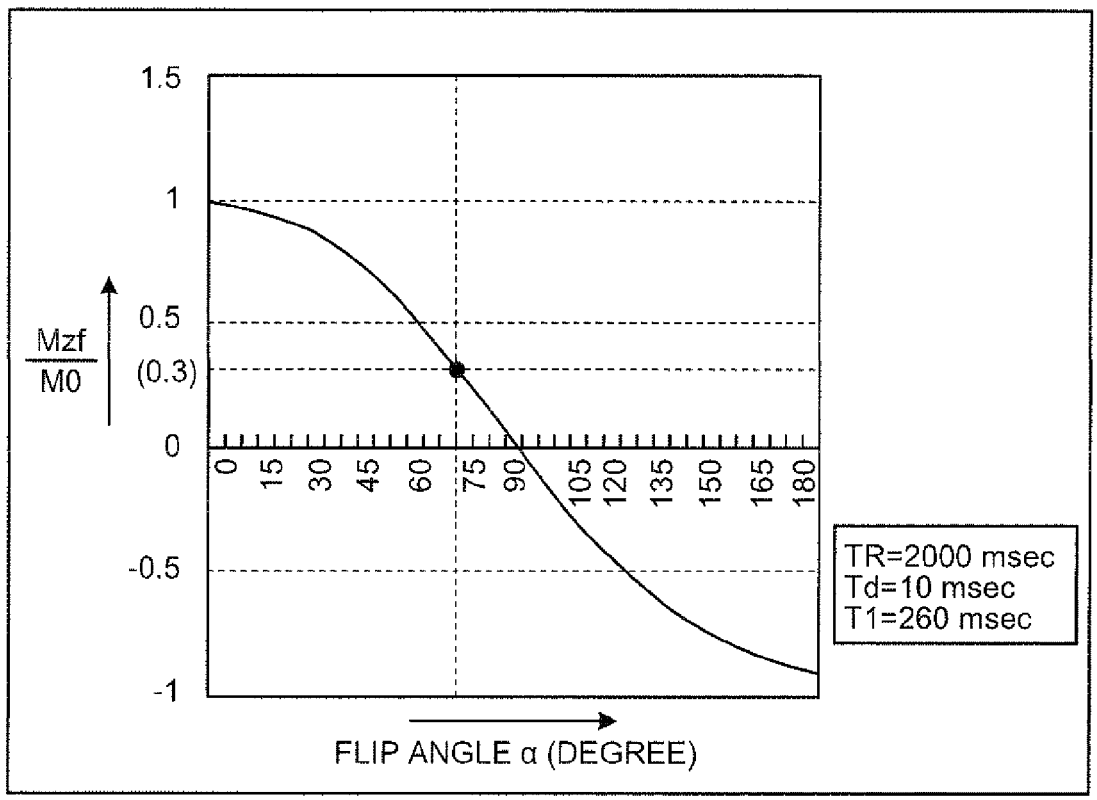
FIG. 7 is a diagram illustrating a relationship between the flip angle of a fat-suppression pulse and a fat-suppression level performed by the multi-slice method according to the embodiment.

Precisely, the fat-suppression level (1−Mzf/M0) is a function of the repetition time TR, the longitudinal relaxation time T1, the time interval Td between the time t1 of irradiation of a fat-suppression pulse and the time t3 of irradiation of the 90-degree RF pulse, and the flip angle α of the fat-suppression pulse. For example, where TR=2000 milliseconds (msec), T1=250 msec, and Td=10 msec; Mzf/M0 of the flip angle α of the fat-suppression pulse is to be as shown in FIG. 7 by using the Expressions (1) and (2). According to FIG. 7, when a desired fat-suppression level is 70% (i.e., Mzf/M0=0.3), it can be achieved by setting the flip angle α of the fat-suppression pulse to approximately 75 degrees. The longitudinal relaxation time T1 of fat tissue and the time interval Td are usually set without depending on scanning conditions, so that the flip angle α is substantially determined in accordance with the repetition time TR.

A computing program based on the Expressions (1) and (2) is preliminarily stored in the memory circuit included in the flip-angle calculating unit 10. On the other hand, the arithmetic circuit of the flip-angle calculating unit 10 calculates the flip angle α for achieving the fat-suppression level by inputting the repetition time TR of the scanning parameters supplied from the scanning-parameter storage unit 9 based on the scanning conditions of the MRI scan set by the scan-condition setting unit 82 of the input unit 8, the longitudinal relaxation time T1 of fat tissue and the time interval Td, both of which are predetermined, and a desired fat-suppression level supplied via the control unit 11 from the fat-suppression level setting unit 83 of the input unit 8, into the computing program read from the memory circuit.

Figure 8:
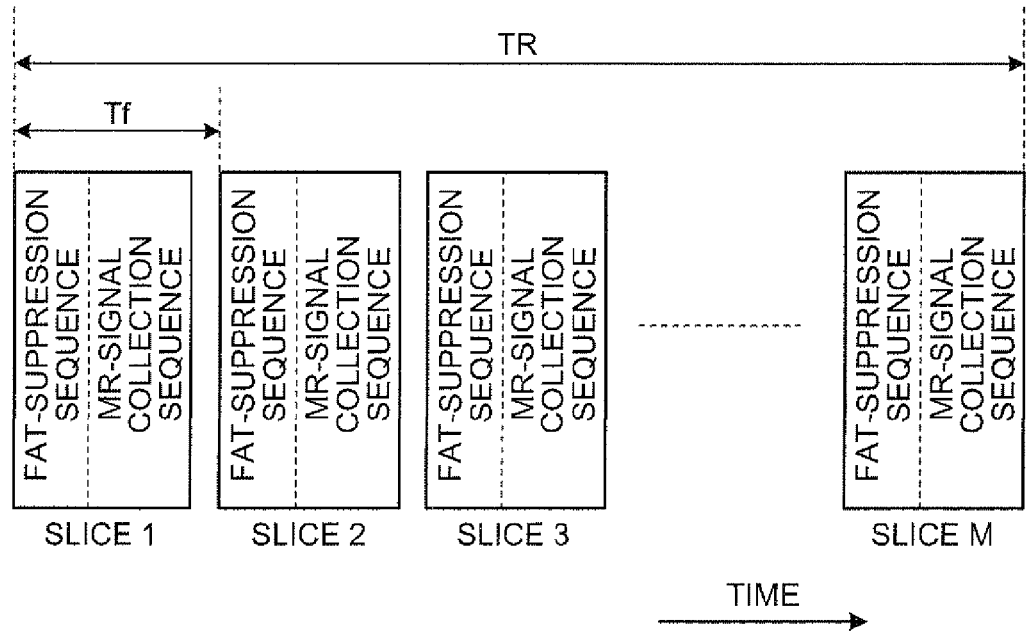
FIG. 8 is a schematic diagram illustrating a collection method of MR signals performed by the multi-slice method according to the embodiment.

According to the SE method, the FSE method, the FE method, and the like, each of which is a typical pulse sequence, the multi-slice method for collecting MR signals of a plurality of slices during the repetition time TR is applied. FIG. 8 schematically depicts collection of MR signals by the multi-slice method. For example, when collecting MR signals of M slices during the repetition time TR, collection of MR signals of each of a slice 1 to a slice M is performed through the fat-suppression sequence and the MR-signal collection sequence similarly to the case shown in FIG. 6.

Where the repetition time of MR signals of slice planes of M slices is TR, a collection time of MR signals of each slice plane (i.e., a fat-suppression pulse interval) Tf is expressed as Tf=TR/M. The flip angle α of a fat-suppression pulse used in the multi slice can be calculated based on Expression (3) described below that the repetition time TER in the Expressions (1) and (2) is replaced by the fat-suppression pulse interval Tf.

$$\frac{Mz+}{M0} \propto \frac{\left\{1 - \exp\left(-\frac{Tf}{T1}\right)\right\} \cos\alpha}{1 - \cos\alpha \cdot \exp\left(-\frac{Tf}{T1}\right)} \quad (3)$$

$$\frac{Mzf}{M0} \propto \frac{Mz+}{M0} + \left(1 - \frac{Mz+}{M0}\right)\left\{1 - \exp\left(-\frac{Td}{T1}\right)\right\}$$

In such case, the arithmetic circuit of the flip-angle calculating unit 10 calculates the fat-suppression pulse interval Tf from the repetition time TR and the number of slices M among the scanning parameters (see FIG. 5) supplied from the scanning-parameter storage unit 9 based on the scanning conditions of the MRI scan set by the scan-condition setting unit 82 of the input unit 8. The arithmetic circuit of the flip-angle calculating unit 10 then calculates the flip angle α for achieving the fat-suppression level by inputting the obtained fat-suppression pulse interval Tf, the longitudinal relaxation time T1 of fat tissue and the time interval Td, both of which are predetermined, and a desired fat-suppression level supplied via the control unit 11 from the fat-suppression level setting unit 83 of the input unit 8, into the computing program read from the memory circuit.

Figure 9:
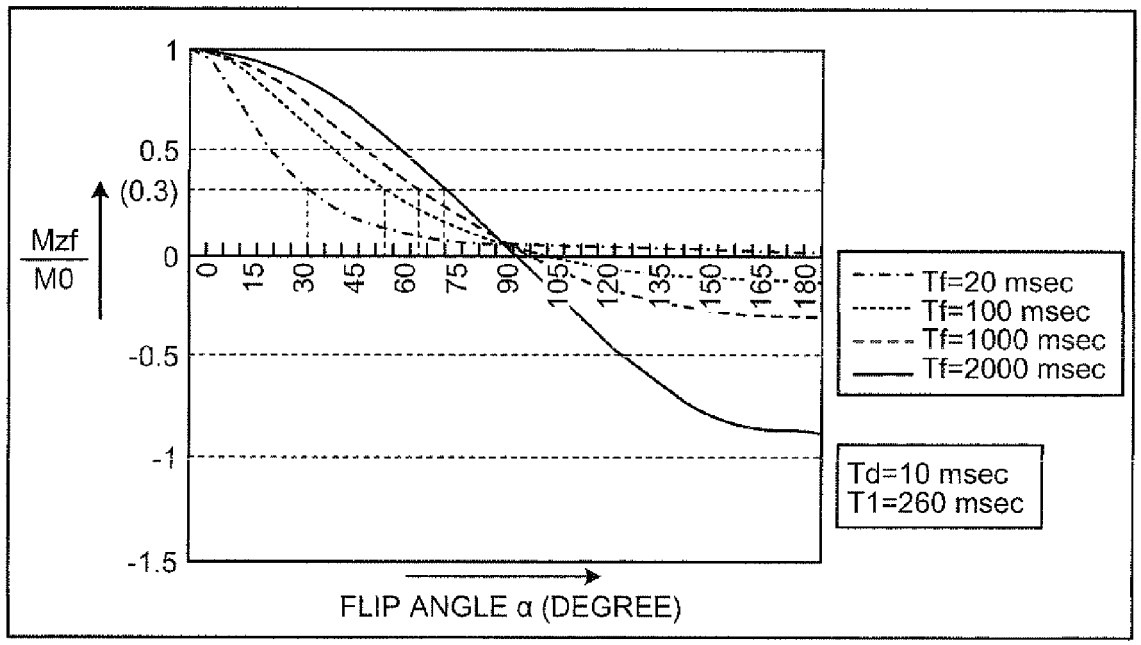
FIG. 9 is a diagram illustrating a relationship between a flip angle of a fat-suppression pulse and a fat-suppression level performed by the multi-slice method according to the embodiment.

FIG. 9 depicts the relationship between Mzf/M0 and the flip angle α of the fat-suppression pulse with respect to various values of the fat-suppression pulse interval Tf. For example, according to the FSE method by which more MR signals can be collected within a short time period by continuously irradiating RF pulses in a plurality of number of times, and when collecting all MR signals of one slice during the repetition time TR, Tf=TR; and as described above, when Tf is 2000 msec, image data at the fat-suppression level 70% can be obtained by setting the flip angle α of the fat-suppression pulse to 75 degrees.

However, to reduce a collection time of MR signals of a large number of slices, for example, if the number of phase encoding directions is reduced, and a collection time of MR signals of one slice, i.e., the fat-suppression pulse interval Tf, is set to 100 msec, the flip angle α of the fat-suppression pulse needs to be set to approximately 55 degrees to obtain the fat-suppression level of 70%. In other words, when the flip angle α of the fat-suppression pulse remains at 75 degrees, image data in which fat signals are excessively reduced is created.

According to the SE method or the FE method, for example, if a collection time of MR signals of one slice is further reduced, and the fat-suppression pulse interval Tf is reduced to 20 msec, the flip angle α of the fat-suppression pulse needs to be set to 35 degree to obtain the fat-suppression level of 70%.

For the purpose to simplify explanations, only an influence of the fat-suppression pulse is used in a calculation of longitudinal magnetization in the Expressions (2) and (3) and FIGS. 7 and 9, and an influence of the RF pulse in the MR-signal collection sequence is not taken into account. However, if types of a pulse sequence and scanning conditions are determined, longitudinal magnetization in a stationary state can be similarly obtained.

The control unit 11 in FIG. 1 includes a main control unit 111 and a sequence control unit 112. The main control unit 111 includes a Central Processing Unit (CPU) and a memory circuit, both of which are not shown, and has a function of totally controlling the MRI apparatus 100. The memory circuit of the main control unit 111 stores therein longitudinal relaxation times of fat tissue and water tissue, both of which are predetermined, the time interval Td between the fat-suppression pulse and the 90-degree RF pulse, the magnetic resonance frequencies f0f and f0w of fat tissue and water tissue, and various pulse sequence data that can be applied to the MR-signal collection sequence (for example, the center frequency, the band, the level, the supply time, the supply timing, and the like, of a pulse current to be supplied to the transmitting coil 31 in each pulse sequence), and further stores therein information, such as information about a subject, scanning conditions, a fat-suppression level, and the like, which are input, set, or selected via the input unit 8. The CPU of the main control unit 111 controls each unit of the MRI apparatus 100 based on the above various information stored in the memory circuit, and performs an MRI scan onto the subject 150.

On the other hand, the sequence control unit 112 of the control unit 11 includes a not-shown CPU, and creates a sequence control signal based on pulse sequence data of the fat-suppression sequence and the MR-signal collection sequence supplied from the main control unit 111. The sequence control unit 112 then controls a pulse current to the gradient magnetic-field coils 21 and the transmitting coil 31 by supplying the created sequence control signal to the gradient magnetic-field power-source 22 of the gradient magnetic-field generating unit 2 and the transmitting unit 32 of the transmitting-receiving unit 3.

(Procedure of MRI Scan)

A procedure of an MRI scan according to the embodiment is explained below with reference to a flowchart shown in FIG. 10. Although a case where image data of one slice is created by applying the SE method is described below, the present invention is not limited to this.

Figure 10:
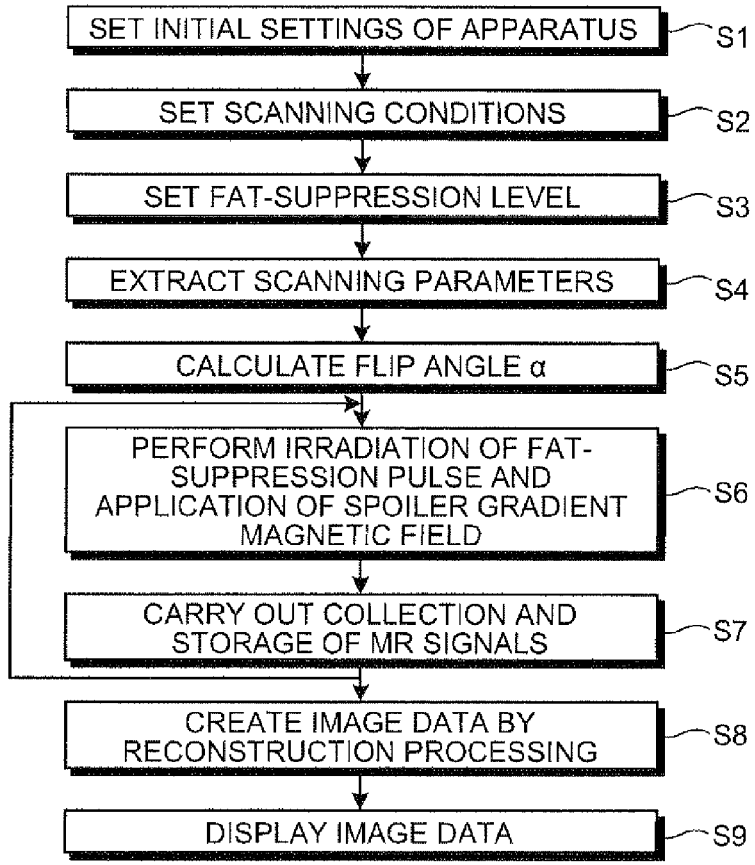
FIG. 10 is a flowchart illustrating a procedure of an MRI scan according to the embodiment.

Prior to an MRI scan of the subject 150, an operator of the MRI apparatus 100 arranges a scan target portion into the field of view of the gantry by moving the subject 150 placed on the patient couch top 4 in the z-axis direction, and then carries out initial settings via the input unit 8, such as input of subject information, setting of image-data creating conditions, setting of image-data display conditions, and the like (Step S1 in FIG. 10).

The operator then selects a fat-suppression scan mode via the scan-mode selecting unit 81 of the input unit 8, then sets scanning conditions of the MRI scan of the subject 150 (the scan portion, the scan target, the image contrast, and the like) via the scan-condition setting unit 82 (Step S2 in FIG. 10), and furthermore sets a desired fat-suppression level via the fat-suppression level setting unit 83 (Step S3 in FIG. 10).

When setting the fat-suppression level, the operator provisionally sets a desired fat-suppression level by using the input device provided in the fat-suppression level setting unit 83, and then the display-data creating circuit of the display unit 7 that receives the set information and the above scanning conditions via the main control unit 111 of the control unit 11 reads sample image data corresponding to the received information from the sample image-data storage unit 6, and display it on the monitor of the display unit 7.

If no sample image data corresponding to the fat-suppression level is present in the sample image-data storage unit 6, the display-data creating circuit reads sample image data (first sample image data) under the scanning conditions corresponding to each of a plurality of fat-suppression levels set via the input unit 8 from the sample image-data storage unit 6.

The display-data creating circuit creates sample image data (second sample image data) corresponding to the provisional fat-suppression level by performing weighted addition on the image data, and displays the created sample image data onto the display unit 7. The operator then determines appropriateness of the provisionally set fat-suppression level by observing the sample image data displayed on the display unit 7, and definite setting of the fat-suppression level based on a result of the determination.

On the other hand, at first, the Flip-angle calculating unit 10 that receives setting information about scanning conditions and the fat-suppression level supplied by the scan-condition setting unit 82 and the fat-suppression level setting unit 83 of the input unit 8 via the main control unit 111 of the control unit 11 extracts scanning parameters corresponding to the scanning conditions from among various scanning parameters stored in the scanning-parameter storage unit 9 (Step 84 in FIG. 10). Then, the flip-angle calculating unit 10 calculates the flip angle α of the fat-suppression pulse for achieving the fat-suppression level by inputting the repetition time TR included in the scanning parameters, the fat-suppression level supplied from the fat suppression level setting unit 83, and the longitudinal relaxation time T1 of fat tissue and the time interval Td between the fat-suppression pulse and the 90-degree RE pulse, both of which are predetermined, into the computing program read from the memory circuit of the flip-angle calculating unit 10 itself (Step S5 in FIG. 10).

The MRI scan is then started in the fat-suppression scan mode as a calculation result of the flip angle α is supplied to the main control unit 111.

When performing the MRI scan in the fat-suppression scan mode, the sequence control unit 112 of the control unit 11 suppresses fat signals in accordance with the calculated flip angle α, and collects MR signals in accordance with the SE method set as the sequence type of the scanning parameters. In other words, the transmitting unit 32 of the transmitting receiving unit 3 generates a certain pulse current based on a control signal supplied from the sequence control unit 112 at the time t1 in the fat-suppression sequence. The transmitting coil 31 supplied with the pulse current irradiates a scan target portion determined in accordance with a size of the transmitting coil 31 with the fat-suppression pulse having the flip angle α, a predetermined frequency band Δf0*f* and its center frequency at the magnetic resonance frequency f0*f* of fat tissue, and inclines the magnetization vector of fat tissue present in the irradiation area by α degree of the flip angle.

Subsequently, at the time t2 in the fat-suppression sequence following to the irradiation of the fat-suppression pulse, a transverse magnetization component of the magnetization vector inclined by α degree is given with a phase difference by applying the spoiler gradient magnetic field Gp in the phase encoding direction, so that the macroscopic transverse magnetization component of the magnetization vector is caused to disappear (saturate) (Step S6 in FIG. 10).

Subsequently, at a time t3 in the MR-signal collection sequence after the time interval Td has elapsed since the irradiation of the fat-suppression pulse, irradiation of the 90-degree RF pulse and application of the slice-selective gradient magnetic field Gs for selecting a certain slice are performed onto the scan target portion, so that magnetization vectors of water tissue and suppressed fat tissue present in the selected slice are inclined by 90 degrees.

At the time t4 after the Lime interval TE/2 from the irradiation of the 90-degree RF pulse, the 180-degree RF pulse is irradiated, the slice-selective gradient magnetic field Gs is applied. At that time, a phase difference in the magnetization vectors of the water tissue and the fat tissue on the slice, which is increasing during the period [t3-t4], is gradually decreased by irradiation of the 180-degree RF pulse. At the time t5 after the time interval TE/2 from the irradiation of the 180-degree RF pulse, the phases of the magnetization vectors match with each other and an MR signal is detected. The MR signal is detected by the receiving coil 33 under presence of the readout gradient magnetic field Gr applied at the time t5, and the detected MR signal is processed through amplification, intermediate frequency conversion, phase detection, filtering, A/D conversion, and the like, and stored in the MR-signal storage unit 51 of the image-data creating unit 5 together with scan-position information, such as slice encoding information, and phase-encoding information (Step S7 in FIG. 10).

According to the above procedure, MR signals with respect to one of the phase encoding directions required for creating image data are collected and stored, and MR signals of one slice required for creating image data are collected and stored by repeating collection of MR signals with the repetition time TR while renewing the degree of the phase encoding gradient through the similar procedure (Steps S6 to S7 in FIG. 10).

On the other hand, the high-speed computing unit 52 of the image-data creating unit 5 reads the MR signals once stored in the MR-signal storage unit 51 and the scan position information, and creates image data by performing image reconstruction processing based on the MR signals and the scan position information (Step S8 in FIG. 10). The obtained image data is then displayed on the display unit 7 via the image-data storage unit 53 (Step S9 in FIG. 10).

According to the above-described embodiment of the present invention, by suppressing MR signals generated from fat tissue of a subject to a desired level, image data that has an appropriate contrast between tissues based on the MR signals of water signal and the MR signals of the suppressed fat tissue can be created. Accordingly, a clear distinction between fat tissue and other tissues of which MR-signal strength is low can be displayed, thereby improving a diagnosis performance.

Particularly, according to the embodiment, when setting the fat-suppression level, the operator can determine the appropriateness of a fat-suppression level that is determined by preliminarily observing sample image data corresponding to the provisionally set fat-suppression level, thereby accurately and easily setting the fat-suppression level that achieves creation of image data having an appropriate contrast between tissues.

Moreover, the sample image data corresponding to a provisional fat-suppression level can be easily obtained from among a plurality of pieces of sample data preliminarily collected with respect to various fat-suppression levels and various scanning conditions; and if none of the pieces of the sample image data corresponds to the provisional fat-suppression level, image data can be created by adding a plurality of sample data of different fat-suppression levels. Accordingly, sample image data at the provisionally-set fat-suppression level can be easily obtained based on the preliminarily-collected pieces of the sample image data.

Although the embodiment according to the present invention has been described above, the present invention is not limited to the above embodiment, and can be modified. For example, although the MRI apparatus 100 according to the embodiment is explained above in a case where the MRI apparatus 100 includes the flip-angle calculating unit 10, and calculates and automatically sets a flip angle of a fat-suppression pulse for achieving a fat-suppression level set via the fat-suppression level setting unit 83 of the input unit 8 by inputting the fat-suppression level and scanning parameters supplied from the scanning-parameter storage unit 9 into a certain computing program; the MRI apparatus 100 can also be configured to display the calculated flip angle, and to allow the operator to confirm or to correct the flip angle, instead of automatic setting.

Moreover, for example, respective flip angles appropriate to heavy, medium, and light fat-suppression scan modes as shown in FIG. 11 can be preliminarily stored in the scanning-parameter storage unit 9 together with the scanning parameters described above (namely, sequence type, repetition time TR, echo time TE, the number of slices M, field of view FOV, and image matrix shown In FIG. 5). According to this method, an MRI scan in the fat-suppression scan mode can be performed by using the flip angle read together with other scanning parameters based on the scanning conditions set via the scan-condition setting unit 82 of the input unit 8, or a flip angle corrected from the read flip angle via the input unit 8 as required. Consequently, complicated calculations based on the Expressions (1), (2), and (3) are not needed, and a time for setting the flip angle can be substantially reduced.

Furthermore, as shown in FIG. 12, respective flip angles appropriate to the heavy, medium, and light fat-suppression scan modes can be preliminarily stored with respect to each of the pulse sequences. For example, according to the FSE method, the fat-suppression pulse interval is constant as long as the number of MR signals is constant under a condition of the number of slices is at the maximum, even if the repetition time TR or the number of slices M is changed. Therefore, the flip angle of a fat-suppression pulse for achieving a desired fat-suppression level can be set based on the desired fat-suppression level and the maximum number of slices that can be scanned within the repetition time TR set by the operator prior to the MRI scan, by storing flip angles of a fat-suppression pulse corresponding to certain fat-suppression levels (heavy, medium, and light fat-suppression levels) with respect to each of pulse sequences categorized in accordance with a time required for collecting MR signals of one slice.

On the other hand, although the embodiment is described above in a case of collecting MR signals (namely, water signals and suppressed fat signals) generated from a scan target portion of the subject 150 by applying the SE method using the 90-degree RF pulse and the 180-degree RF pulse, another methods, such as the FSE method, the FE method, or the EPI method, can be applied.

Furthermore, although it is described above in a case where the high-speed computing unit 52 according to the embodiment creates two-dimensional image data by reconstructing two-dimensional MR signals supplied from the receiving unit 34, the high-speed computing unit 52 can be configured to create volume data by performing reconstruction processing using a three-dimensional Fourier transform on three-dimensional MR signals supplied from the receiving unit 34, and then to create three-dimensional image data or MPR image data based on the volume data.

Moreover, although the embodiment is described above in a case of using the SE method, when using the gradient echo method in which a repetition time is short, if a fat-suppression pulse is applied before each data collection, an extension of the total scan time cannot be accepted, therefore, a data collection method of a segment division type is used, that is, a k-space is divided into segments, and one time of a pre-pulse is applied to each of the segments. In a case of two-dimensional imaging, the number of data collections carried out during a period of one segment is that the number of data lines required for filling the k-space is divided by the number of the segments, and the repetition time TR multiplied by the number of data collections is a time period of one segment, i.e., an interval of application of the fat-suppression pulse. In a case of the spin warp method, the total number of data collections is a phase encoding matrix. A ratio of the longitudinal magnetization component Mz+ of fat of each fat-suppression pulse to the longitudinal magnetization component M0 in the initial state can be similarly calculated by replacing TR in the Expression (1) by (the phase-encoding matrix number/the number of segments)*TR.

Figure 13:
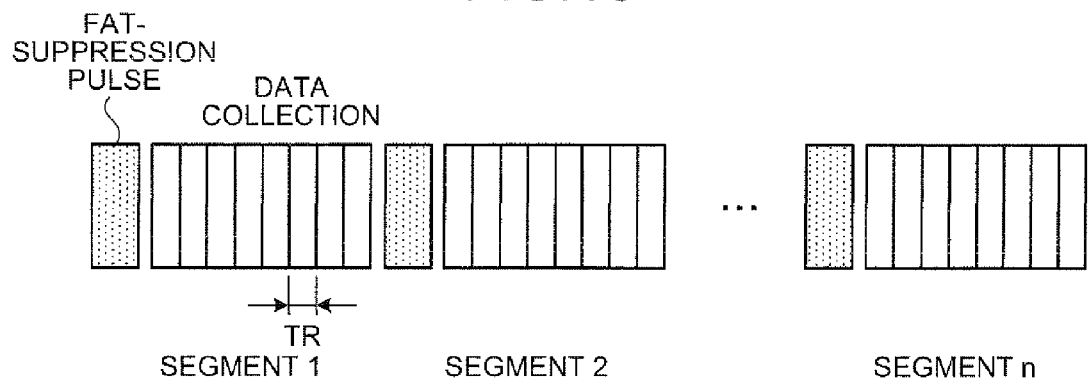
FIG. 13 is a diagram illustrating an example of a pulse sequence of a segment division type.

The flip angle of a fat-suppression pulse that gives the same level of fat suppression changes depending on a phase-encoding matrix number, the number of segments, and the repetition time TR of a pulse sequence. FIG. 13 depicts an example of a pulse sequence of the segment division type using a fat-suppression pulse. The example is a case where a k-space is divided into n segments, for example, if the phase-encoding matrix number is 128 and the number of segments n is 16, the number of data collections in a segment is 8.

In a case of three-dimensional imaging, phase encoding in the slice direction is additionally taken into account. The order of three-dimensional data collection can be a case of collecting phase-encoded data on a plane at first, a case of collecting data phase-encoded in the slice direction at first, or a method of collecting data of the both in a mixed manner. The flip angle of a fat-suppression pulse that gives the same level of fat suppression can be obtained in any of the cases as long as a pulse sequence is settled from scanning conditions.

Although the embodiment is described above in a case of the Chemical Shift Selective (CHESS) method, there is another method of collecting signals at a time when the longitudinal magnetization component of fat becomes zero after an inversion pulse by using an Inversion Recovery (IR) method, in addition to the CHESS method. An IR method that is used particularly for fat suppression is called as Short TI Inversion Recovery (STIR) method. According to the method, different from the CHESS method, water signals in an area of interest are also excited by an inversion pulse, consequently the value of a water signal is decreased compared with a case of not using the IR method; however, because the STIR method is not a method depending on chemical shift, and has an advantage that it is not influenced by uniformity of the static magnetic field, therefore, it is used when a uniform fat suppression is desired in a portion in which it is difficult to ensure magnetic uniformity.

Figure 14:
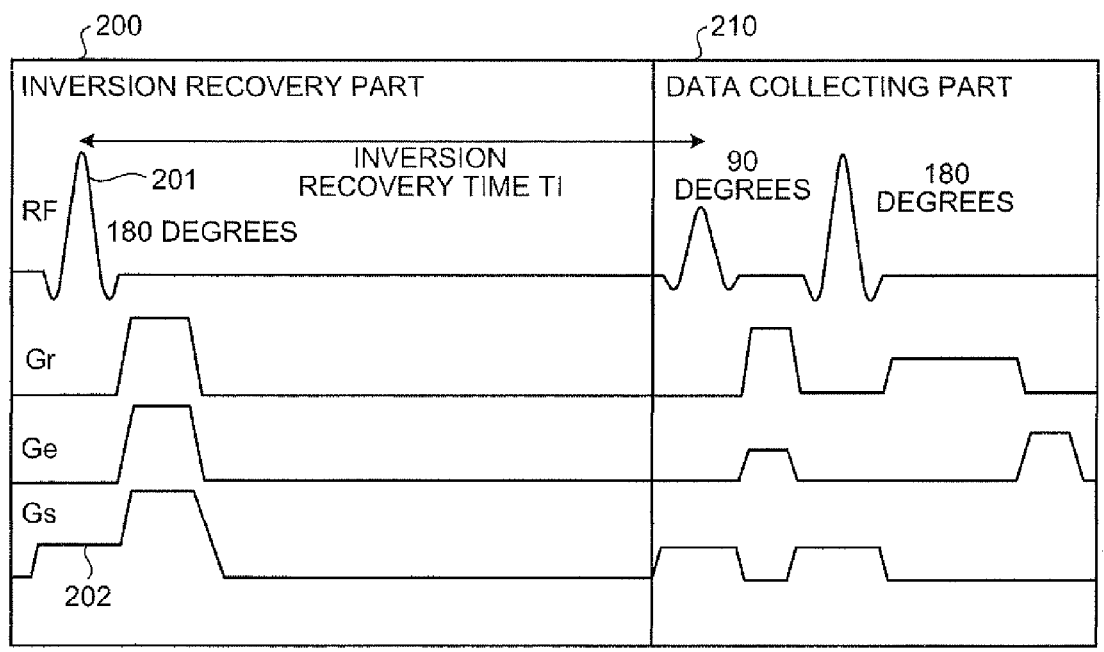
FIG. 14 is a diagram illustrating an example of a pulse sequence of an inversion recovery method.

A pulse sequence of the STIR method is shown in FIG. 14. The pulse sequence includes an inversion recovery part 200 including an inversion pulse 201 that inverses magnetization in the area of interest, and a data collecting part 210 following to the inversion recovery part 200. The data collecting part 210 depicts an example of the spin echo. The flip angle of an inversion pulse is set to 180 degrees, and the inversion pulse inverses the polarity of a longitudinal magnetization component Mz. The transverse magnetization component on the xy plane caused by imperfection of the flip angle of the inversion pulse is given with a phase difference corresponding to the position by a spoiler gradient pulse 202, and loses a net macroscopic magnetization component. The longitudinal magnetization component of which polarity is inversed by the inversion pulse is then recovered at a rate depending on the longitudinal relaxation time T1 of tissue, and during a process of the recovery, excitation is performed by the 90-degree RF pulse for data collection after a time TI, so that an image contrast that is enhanced with the longitudinal relaxation time T1 can be obtained. In a case of the STIR method, the time TI is set such that particularly the signal value of fat becomes zero. The data collecting part 210 following to the inversion recovery part 200 depicts the spin echo in this example, and it is the same as the fat-suppression method using a CHESS pulse, therefore an explanation of it is omitted.

It is known that when executing the method, a ratio of the longitudinal magnetization component Mz in the stationary state immediately before an excitation pulse 211 to the longitudinal magnetization component M0 in the initial state is given as follows:

$$Mz/M0 = 1 - 2*\exp(-TI/T1) + \exp(-TR/T1) \quad (4)$$

where the repetition time is TR, the inversion recovery time is TI, and the longitudinal relaxation time is T1.

For example, suppose that the repetition time of the pulse sequence is TR=500 msec, and the longitudinal relaxation time of fat at 1.5 T is T1=230 msec; to make fat signal immediately before the excitation to zero, TI is obtained by substituting Mz/M0=0 into the Expression (4) as follows:

$$TI = T1*\ln(2/(1+\exp(-TR/T1))) = 134.6 \text{ msec}$$

Similarly, when collecting an image in which fat signals are left approximately 30%, TI is obtained by substituting Mz/M0=−0.3 into the Expression (4) as follows:

$$TI = T1*\ln(2/(1+0.3+\exp(-TR/T1))) = 79.8 \text{ msec}$$

The reason for the substitution of −0.3 instead of Mz/M0=0.3 is as follows.

The polarity of longitudinal magnetization is inversed by an inversion pulse, and then recovered from negative to positive. When considering that an image obtained by MRI is expressed in absolute values, timing of excitation at which the signal strength of imaging becomes 0.3 can be Mz/M0=−0.3 and +0.3. When Mz/M0 is −0.3, the time TI becomes shorter than otherwise, it has a less influence on tissue that has a relaxation time longer than fat tissue, and a time of a pulse sequence becomes shorter.

Figure 15:
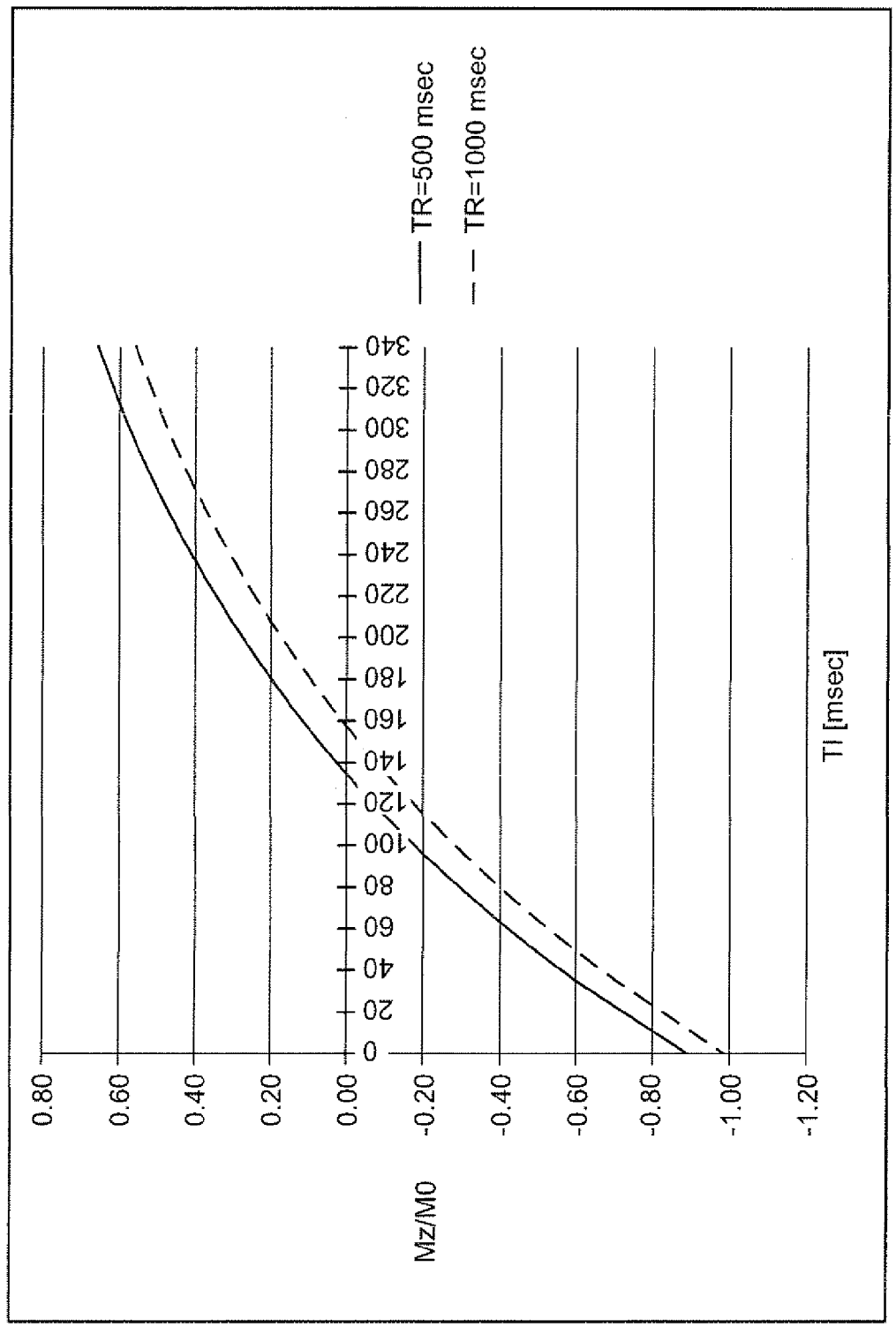
FIG. 15 is a diagram illustrating a relationship between longitudinal magnetization and a time TI according to the inversion recovery method.

Furthermore, according to the Expression (4), the time TI depends on the repetition time TR of the pulse sequence. For example, when the repetition time TR is extended from 500 msec to 1000 msec, TI that makes Mz/M0 zero changes from 134.6 msec to 156 msec, and TI with which fat signals are left 30% changes from 79.8 msec to 96.8 msec. Such state is shown in FIG. 15.

As described above, a suppression level of fat signals according to the IR depends on other parameters of a pulse sequence, therefore, to achieve a desired fat-suppression level, it is desired to calculate a time TI from scanning conditions every time, or to store the time TI with respect to each of scanning conditions. When collecting MR signals of multi-slice, a time TI is to be set per slice.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A Magnetic Resonance Imaging (MRI) apparatus comprising:
    a flip-angle setting unit that sets a flip angle of a fat-suppression pulse, based on (a) plural possible fat-suppression levels and (b) at least one scanning condition of an MRI scan to which a fat-signal suppression method is to be applied;
    a transmitting-receiving unit that creates a fat-suppression pulse having the set flip angle;
    a sequence control unit that controls irradiation of the fat-suppression pulse and application of a spoiler gradient magnetic field to a scan target portion of a subject, and suppresses an MR signal generated from fat tissue in the scan target portion to a predetermined magnitude corresponding to one of said plural possible fat-suppression levels; and
    an image-data creating unit that creates image data based on MR signals collected by applying an MRI pulse sequence to the scan target portion in which the MR signal from the fat tissue is suppressed.

2. The apparatus according to claim 1, further comprising:
    a fat-suppression level input unit that receives an input of a fat-suppression level selected from among the plurality of fat-suppression levels;
    a scanning-condition input unit that receives an input of a scanning condition of the MRI scan; and
    a scanning-parameter storage unit that stores scanning parameters corresponding to various scanning conditions, wherein
    the flip-angle setting unit includes a flip-angle calculating unit that calculates a flip angle of the fat-suppression pulse, based on the fat-suppression level received by the fat-suppression level input unit and a scanning parameter corresponding to the scanning condition extracted from the scanning-parameter storage unit.

3. The apparatus according to claim 2, wherein
    the flip-angle calculating unit includes a storage unit that preliminarily stores a predetermined computing program that is to calculate a flip angle of the fat-suppression pulse, and
    the flip-angle calculating unit calculates the flip angle by inputting the selected fat-suppression level and the scanning parameter into the computing program read from the storage unit.

4. The apparatus according to claim 2, wherein the fat-suppression level input unit selects and sets a desired fat-suppression level from among a predetermined plurality of predetermined fat-suppression levels.

5. The apparatus according to claim 3, wherein the fat-suppression level input unit selects and sets a desired fat-suppression level from among a predetermined plurality of predetermined fat-suppression levels.

6. The apparatus according to claim 2, wherein the fat-suppression level input unit includes an input device capable of arbitrarily setting a desired fat-suppression level from a range of possible levels.

7. The apparatus according to claim 3, wherein the fat-suppression level input unit includes an input device capable of arbitrarily setting a desired fat-suppression level.

8. The apparatus according to claim 1, wherein the flip-angle setting unit includes a scanning-parameter storage unit that stores flip angles of a fat-suppression pulse and scanning parameters corresponding to various scanning conditions.

9. The apparatus according to claim 2, wherein the flip-angle setting unit includes a scanning-parameter storage unit that stores flip angles of a fat-suppression pulse and scanning parameters corresponding to various scanning conditions.

10. The apparatus according to claim 3, wherein the flip-angle setting unit includes a scanning-parameter storage unit that stores flip angles of a fat-suppression pulse and scanning parameters corresponding to various scanning conditions.

11. The apparatus according to claim 4, wherein the flip-angle setting unit includes a scanning-parameter storage unit that stores flip angles of a fat-suppression pulse and scanning parameters corresponding to various scanning conditions.

12. The apparatus according to claim 5, wherein the flip-angle setting unit includes a scanning-parameter storage unit that stores flip angles of a fat-suppression pulse and scanning parameters corresponding to various scanning conditions.

13. The apparatus according to claim 6, wherein the flip-angle setting unit includes a scanning-parameter storage unit that stores flip angles of a fat-suppression pulse and scanning parameters corresponding to various scanning conditions.

14. The apparatus according to claim 7, wherein the flip-angle setting unit includes a scanning-parameter storage unit that stores flip angles of a fat-suppression pulse and scanning parameters corresponding to various scanning conditions.

15. The apparatus according to claim 8, wherein the scanning-parameter storage unit stores information about respective flip angles corresponding to various fat-suppression levels with respect to each of sequence types categorized based on a frequency of fat-suppression pulse generation.

16. The apparatus according to claim 9, wherein the scanning-parameter storage unit stores information about respective flip angles corresponding to various fat-suppression levels with respect to each of sequence types categorized based on a frequency of fat-suppression pulse generation.

17. The apparatus according to claim 1, wherein the scanning condition is at least one of a type of scan pulse sequence, a repetition time TR, number of slices, and time of data collection per slice.

18. The apparatus according to claim 17, wherein the scanning condition is a combination of two from among a type of scan pulse sequence, a repetition time TR, number of slices, and time of data collection per slice.

19. The apparatus according to claim 8, wherein the scanning condition is at least one of a type of scan pulse sequence, a repetition time TR, number of slices, and time of data collection per slice.

20. The apparatus according to claim 19, wherein the scanning condition is a combination of two from among a type of scan pulse sequence, a repetition time TR, number of slices, and time of data collection per slice.

21. An MRI apparatus comprising:
  a fat-suppression level input unit that receives an input of a fat-suppression level of an MRI scan to which a fat-signal suppression method is applied;
  a scanning-condition setting unit that sets a parameter of a fat-Suppression condition for fat suppression, based on a scanning condition of the MRI scan and the fat-suppression level selected from among a plurality of fat-suppression levels through the fat-suppression input unit;
  a sequence control unit that controls irradiation of a fat-suppression pulse with the set parameter and application of a spoiler gradient magnetic field to a scan target portion of a subject, and suppresses an MR signal generated from fat tissue in the scan target portion to a predetermined magnitude; and
  an image-data creating unit that creates image data based on MR signals collected by applying a certain pulse sequence to the scan target portion in which the MR signal from the fat tissue is suppressed.

22. The apparatus according to claim 21, wherein the scanning-condition setting unit determines a parameter of the fat-suppression condition in accordance with a type of fat-suppression method.

23. The apparatus according to claim 22, wherein the scanning-condition setting unit determines a flip angle as a parameter of the fat-suppression condition, when an applied fat-suppression method is a chemical shift selective method in which only magnetization of fat tissue is excited by using a difference between resonance frequencies of a hydrogen nuclear spin in respective tissue, and a transverse magnetization component of the fat tissue is caused to disappear by a spoiler pulse.

24. The apparatus according to claim 22, wherein the scanning-condition setting unit determines an inversion recovery time as a parameter of the fat-suppression condition, when an applied fat-suppression method is an inversion recovery method that uses a difference between a longitudinal relaxation time of a hydrogen nuclear spin in water tissue and a longitudinal relaxation time of a hydrogen nuclear spin in fat tissue.

25. The apparatus according to claim 24, wherein the scanning-condition setting unit determines an inversion recovery time per slice as a parameter of the fat-suppression condition when collecting MR signals of a multi-slice.

* * * * *